(12) United States Patent
Uemura

(10) Patent No.: US 7,867,909 B2
(45) Date of Patent: Jan. 11, 2011

(54) POLISHING COMPOSITION AND POLISHING METHOD

(75) Inventor: Yasuhide Uemura, Nagoya (JP)

(73) Assignee: Fujimi Incorporated, Kiyosu-shi, Aichi (JP)

( * ) Notice: Subject to any disclaimer, the term of this patent is extended or adjusted under 35 U.S.C. 154(b) by 0 days.

(21) Appl. No.: 11/844,014

(22) Filed: Aug. 23, 2007

(65) Prior Publication Data

US 2008/0051010 A1 Feb. 28, 2008

(30) Foreign Application Priority Data

Aug. 24, 2006 (JP) .............................. 2006-227614

(51) Int. Cl.
*H01L 21/461* (2006.01)
*B24B 1/00* (2006.01)
*C09K 3/14* (2006.01)

(52) U.S. Cl. ..................... 438/693; 438/690; 438/691; 438/692; 451/63; 51/308

(58) Field of Classification Search ........... 51/307–308; 106/3; 438/690–694
See application file for complete search history.

(56) References Cited

U.S. PATENT DOCUMENTS

| | | | |
|---|---|---|---|
| 3,715,842 A | 2/1973 | Tredinnick et al. | |
| 4,169,337 A | 10/1979 | Payne | |
| 4,462,188 A | 7/1984 | Payne | |
| 4,588,421 A | 5/1986 | Payne | |
| 5,230,833 A | 7/1993 | Romberger et al. | |
| 5,352,277 A | 10/1994 | Sasaki | |
| 5,916,819 A | 6/1999 | Skrovan et al. | |
| 6,099,604 A | 8/2000 | Sandhu et al. | |
| 6,454,820 B2 | 9/2002 | Hagihara et al. | |
| 6,852,009 B2 | 2/2005 | Kawase et al. | |
| 2001/0003672 A1 | 6/2001 | Inoue et al. | |
| 2003/0068350 A1* | 4/2003 | Sorrentino et al. | .......... 424/401 |
| 2003/0199230 A1* | 10/2003 | Hirabayashi et al. | .......... 451/36 |
| 2004/0077254 A1* | 4/2004 | Ammon, Jr. | .................. 446/15 |
| 2004/0098924 A1 | 5/2004 | Iwasa | |
| 2004/0127047 A1 | 7/2004 | Yamada et al. | |
| 2005/0054203 A1 | 3/2005 | Yamada | |
| 2005/0090104 A1* | 4/2005 | Yang et al. | .................. 438/689 |
| 2005/0136670 A1 | 6/2005 | Ameen et al. | |
| 2005/0173669 A1 | 8/2005 | Kurata et al. | |
| 2005/0194562 A1* | 9/2005 | Lavoie et al. | ............... 252/79.1 |
| 2006/0021972 A1 | 2/2006 | Lane et al. | |
| 2006/0049143 A1* | 3/2006 | Sakamoto | .................... 216/89 |
| 2006/0138086 A1 | 6/2006 | Lane et al. | |
| 2006/0243702 A1 | 11/2006 | Minamihaba et al. | |
| 2007/0049180 A1* | 3/2007 | Shida et al. | .................... 451/41 |
| 2007/0051917 A1* | 3/2007 | Thomas et al. | ............. 252/79.1 |
| 2007/0176141 A1 | 8/2007 | Lane et al. | |

FOREIGN PATENT DOCUMENTS

| | | |
|---|---|---|
| EP | 1205965 A1 | 5/2002 |
| EP | 1223609 A1 | 7/2002 |
| EP | 1702965 A2 | 9/2006 |
| EP | 1757665 A1 | 2/2007 |
| GB | 2383797 A1 | 9/2003 |
| JP | 02158684 | 6/1990 |
| WO | 9932570 | 7/1999 |
| WO | WO 9932570 A1 * | 7/1999 |
| WO | 9964527 | 12/1999 |
| WO | 2004042812 A1 | 5/2004 |

* cited by examiner

*Primary Examiner*—Jerry Lorengo
*Assistant Examiner*—Jared Wood
(74) *Attorney, Agent, or Firm*—Vidas, Arrett & Steinkraus, P.A.

(57) ABSTRACT

A polishing composition contains at least one water soluble polymer selected from the group consisting of polyvinylpyrrolidone and poly(N-vinylformamide), and an alkali, and preferably further contains at least one of a chelating agent and an abrasive grain. The water soluble polymer preferably has a weight average molecular weight of 6,000 to 4,000,000. The polishing composition is mainly used in polishing of the surfaces of semiconductor wafers such as silicon wafers, especially used in preliminary polishing of the surfaces of such wafers.

13 Claims, No Drawings

POLISHING COMPOSITION AND POLISHING METHOD

CROSS-REFERENCE TO RELATED APPLICATIONS

This application claims priority from Japanese Application No.: 2006-227614, filed on Aug. 24, 2006, the entire content of which is hereby incorporated by reference.

BACKGROUND OF THE INVENTION

The present invention relates to a polishing composition mainly used in polishing of a semiconductor wafer and to a polishing method using the polishing composition.

Polishing of a semiconductor wafer such as a silicon wafer is usually divided into at least two stages, preliminary polishing and finish polishing. Of these, preliminary polishing is further divided into two or more stages for the purpose of high quality and efficiency. As a polishing composition usable for finish polishing, a polishing composition described in Japanese Laid-Open Patent Publication No. 02-158684 is known, for example. The polishing composition of the publication comprises water, colloidal silica, a water soluble polymer such as polyacrylamide and sizofuran, and a water soluble salt such as potassium chloride.

In recent years, as design rules for semiconductor devices have required thinner devices, there is a demand for reducing small size LPDs (light point defects), which had not been considered problematic but are now considered to affect the performance of a semiconductor device. An LPD is a kind of defect observed on the surface of a wafer polished by using a polishing composition. Specifically, LPDs with a size of 0.12 µm or larger had been mainly considered problematic, which were caused by particles attached to wafer surfaces. Thus, an improvement in washing technique has largely reduced such LPDs. However, LPDs with a size smaller than the above (>0.065 µm) are mainly caused by scars occurring on wafer surfaces during preliminary polishing, in other words attributable to the polishing process. In many cases, these cannot be removed by finish polishing or washing. In this regard, even when the polishing composition described in Japanese Laid-Open Patent Publication No. 02-158684 is used for finish polishing, the number of LPDs attributable to the polishing process cannot be reduced more than before.

SUMMARY OF THE INVENTION

Accordingly, an object of the present invention is to provide a polishing composition, by using which the number of LPDs attributable to the polishing process can be reduced on the surface of a physical object after being polished, and a polishing method using the polishing composition.

In accordance with a first aspect of the present invention, a polishing composition is provided. The polishing composition contains at least one water soluble polymer selected from the group consisting of polyvinylpyrrolidone and poly(N-vinylformamide), and an alkali.

In accordance with a second aspect of the present invention, a method of polishing is provided. The method includes polishing a surface of a semiconductor wafer using the above polishing composition.

Other aspects and advantages of the invention will become apparent from the following description, illustrating by way of example the principles of the invention.

DETAILED DESCRIPTION OF THE PREFERRED EMBODIMENTS

Hereafter, an embodiment of the present invention will be described.

A polishing composition according to this embodiment is produced by mixing a given amounts of a water soluble polymer, an alkali, and abrasive grains with water. Therefore, the polishing composition of this embodiment consists of a water soluble polymer, an alkali, abrasive grains, and water. This polishing composition is used in polishing of semiconductor wafers such as silicon wafers, especially used in preliminary polishing of such wafers. When the preliminary polishing is divided into two or more stages, this polishing composition is used for a finish stage of preliminary polishing.

A water soluble polymer contained in the polishing composition of this embodiment is at least one compound selected from the group consisting of polyvinylpyrrolidone and poly(N-vinylformamide). These water soluble polymers can form a hydrophilic film on a wafer surface. This hydrophilic film disperses a vertical force, relative to a wafer surface, given to a wafer by coarse particles including abrasive grains into a horizontal direction. As a result, it is expected that the occurrence of defects on the wafer surface during polishing is prevented, and the number of LPDs attributable to the polishing process is reduced.

When a water soluble polymer contained in a polishing composition is polyvinylpyrrolidone, the number of LPDs attributable to the polishing process is reduced in comparison with the use of poly(N-vinyl formamide). Therefore, a water soluble polymer contained in a polishing composition is preferably polyvinylpyrrolidone.

The content of a water soluble polymer in a polishing composition is preferably 0.0003 g/L or more, more preferably 0.001 g/L or more, still more preferably 0.003 g/L or more, and most preferably 0.005 g/L or more. As the content of a water soluble polymer increases, a hydrophilic film that is sufficient to prevent defects from occurring is easily formed on a wafer surface, thereby reducing the number of LPDs attributable to the polishing process. In this regard, when the content of a water soluble polymer in a polishing composition is 0.0003 g/L or more, specifically 0.001 g/L or more, more specifically 0.003 g/L or more, and still more specifically 0.005 g/L or more, the number of LPDs attributable to the polishing process is reduced to a particularly suitable level for practical use.

Further, the content of a water soluble polymer in a polishing composition is preferably 0.1 g/L or less, more preferably 0.02 g/L or less, still more preferably 0.015 g/L or less, and most preferably 0.01 g/L or less. A hydrophilic film by a water soluble polymer allows a polishing composition to reduce the polishing rate (removal rate) of a wafer. Therefore, a decrease of the content of a water soluble polymer in a polishing composition prevents a hydrophilic film from reducing the polishing rate. In this regard, when the content of a water soluble polymer in a polishing composition is 0.1 g/L or less, specifically 0.02 g/L or less, more specifically 0.015 g/L or less, and still more specifically 0.01 g/L or less, the polishing rate reduction by a hydrophilic film is reduced to a particularly suitable level for practical use.

A water soluble polymer contained in a polishing composition has a weight average molecular weight of preferably 6,000 or more. As the weight average molecular weight of a water soluble polymer becomes larger, a hydrophilic film that is sufficient to prevent defects from occurring is easily formed on a wafer surface, thereby reducing the number of LPDs attributable to the polishing process. In this regard, when a water soluble polymer in a polishing composition has a weight average molecular weight of 6,000 or more, the number of LPDs attributable to the polishing process is reduced to a particularly suitable level for practical use.

Further, a water soluble polymer contained in a polishing composition has a weight average molecular weight of preferably 4,000,000 or less, and more preferably 3,000,000 or less. A smaller weight average molecular weight of a water soluble polymer prevents a hydrophilic film from reducing the polishing rate of a wafer. In this regard, when the weight average molecular weight of a water soluble polymer in a polishing composition is 4,000,000 or less, and specifically 3,000,000 or less, the polishing rate reduction by a hydrophilic film is reduced to a particularly suitable level for practical use.

An alkali contained in the polishing composition of the present embodiment may be, for example, any of alkali metal hydroxides, ammonia, amines, and quaternary ammonium salts. These alkalis can chemically polish a wafer and increase the rate of polishing a wafer by a polishing composition.

When an alkali contained in a polishing composition is an alkali metal hydroxide or a quaternary ammonium salt, the wafer polishing rate by the polishing composition largely increases and additionally an increase of surface roughness of a polished wafer is more prevented in comparison with the use of other alkalis. Therefore, an alkali contained in a polishing composition is preferably an alkali metal hydroxide or a quaternary ammonium salt.

The content of an alkali in a polishing composition is preferably 0.1 g/L or more, more preferably 0.25 g/L or more, and still more preferably 0.5 g/L or more. As the content of an alkali in a polishing composition increases, the wafer polishing rate by the polishing composition increases. In this regard, when the content of an alkali in a polishing composition is 0.1 g/L or more, specifically 0.25 g/L or more, and more specifically 0.5 g/L or more, the wafer polishing rate by the polishing composition is increased to a particularly suitable level for practical use.

Further, the content of an alkali in a polishing composition is preferably 5 g/L or less, more preferably 4 g/L or less, and more preferably 3 g/L or less. An alkali may cause an increase of surface roughness of a polished wafer. Thus, as the content of an alkali in a polishing composition decreases, an increase of surface roughness of a polished wafer is more prevented. In this regard, when the content of an alkali in a polishing composition is 5 g/L or less, specifically 4 g/L or less, and more specifically 3 g/L or less, an increase of surface roughness of a polished wafer is prevented to a particularly suitable level for practical use.

Abrasive grains contained in the polishing composition of the present embodiment may be, for example, any of colloidal silica and fumed silica. These abrasive grains can mechanically polish a wafer and increase the rate of polishing a wafer by a polishing composition.

When abrasive grains contained in a polishing composition are colloidal silica, the stability of a polishing composition is enhanced in comparison with the use of other abrasive grains. As a result, scratches on the surface of a polished wafer are decreased. Therefore, abrasive grains contained in a polishing composition are preferably colloidal silica.

The content of abrasive grains in a polishing composition is preferably 1 g/L or more, more preferably 3 g/L or more, and still more preferably 5 g/L or more. As the content of abrasive grains in a polishing composition increases, the water polishing rate by the polishing composition is increased. In this regard, when the content of abrasive grains in a polishing composition is 1 g/L or more, specifically 3 g/L or more, and more specifically 5 g/L or more, the polishing rate is increased to a particularly suitable level for practical use.

Further, the content of abrasive grains in a polishing composition is preferably 45 g/L or less, more preferably 35 g/L or less, and still more preferably 25 g/L or less. A decreased content of abrasive grains in a polishing composition enhances the colloid stability of the polishing composition. In this regard, when the content of abrasive grains in a polishing composition is 45 g/L or less, specifically 35 g/L or less, and more specifically 25 g/L or less, the colloid stability of the polishing composition is enhanced to a particularly suitable level for practical use.

The average primary particle diameter of abrasive grains contained in a polishing composition is preferably 5 nm or more, more preferably 10 nm or more, and still more preferably 15 nm or more. A larger average primary particle diameter of abrasive grains strengthens the function of the abrasive grains for mechanically polishing a wafer, thereby increasing the wafer polishing rate by a polishing composition. In this regard, when the average primary particle diameter of abrasive grains is 5 nm or more, specifically 10 nm or more, and more specifically 15 nm or more, the wafer polishing rate by a polishing composition is increased to a particularly suitable level for practical use.

Further, the average primary particle diameter of abrasive grains contained in a polishing composition is preferably 200 nm or less, more preferably 150 nm or less, and still more preferably 100 nm or less. A larger average primary particle diameter of abrasive grains may cause an increase of scratches on the surface of a polished wafer. Therefore, a smaller average primary particle diameter of abrasive grains prevents an increase of scratches on the surface of a polished wafer. In this regard, when the average primary particle diameter of abrasive grains is 200 nm or less, specifically 150 nm or less, and more specifically 100 nm or less, an increase of scratches on the surface of a polished wafer is prevented to a particularly suitable level for practical use.

The present embodiment provides the following advantages.

The polishing composition of the present embodiment contains at least one water soluble polymer selected from the group consisting of polyvinylpyrrolidone and poly(N-vinyl formamide). This water soluble polymer forms a hydrophilic film on a wafer surface, and the film works to reduce the number of LPDs attributable to the polishing process. Therefore, the polishing composition of the present embodiment reduces the number of LPDs, attributable to the polishing process, on the surface of a wafer polished by using the polishing composition.

The above embodiment may be modified as follows.

The polishing composition of the above embodiment may further contain a chelating agent. The chelating agent forms a complex ion with metal impurities in a polishing composition, thereby capturing the metal impurities. This prevents an object to be polished from being contaminated with metal impurities. The chelating agent may be aminocarboxylic acid-based chelating agents or phosphonic acid-based chelating agents. Among these, preferably contained is ethylenediaminetetraacetic acid, diethylenetriaminepentaacetic acid, triethylenetetraaminehexaacetic acid, ethylenediaminetetramethylphosphonic acid, or diethylenetriaminepentamethylphosphonic acid, Ethylenediaminetetraacetic acid, diethylenetriaminepentaacetic acid, triethylenetetraaminehexaacetic acid, ethylenediaminetetramethylphosphonic acid, and diethylenetriaminepentamethylphosphonic acid have a particularly high ability to capture metal impurities.

Known additives such as a preservative or an antifoaming agent may be added, if necessary, to the polishing composition of the above embodiment.

The polishing composition of the above embodiment may be prepared by diluting a liquid concentrate before use.

The polishing composition of the above embodiment may be used in polishing of physical objects other than semiconductor wafers.

Next, Examples of the present invention and Comparative Examples will be described.

The polishing compositions of Examples 1 to 53 and Comparative Examples 1 to 26 were prepared by properly mixing a water soluble polymer, an alkali, abrasive grains, and a chelating agent with water. The detailed of the water soluble polymer, alkali, abrasive grains, and chelating agent in each polishing composition are shown in Tables 1 and 2.

In the column entitled "water soluble polymer" of Tables 1 and 2:

PVP[*1] represents polyvinylpyrrolidone having a weight average molecular weight of 10,000;

PVP[*2] represents polyvinylpyrrolidone having a weight average molecular weight of 3,500,000;

PVP[*3] represents polyvinylpyrrolidone having a weight average molecular weight of 1,600,000;

PVP[*4] represents polyvinylpyrrolidone having a weight average molecular weight of 67,000;

PNVF represents poly(N-vinyl formamide) having a weight average molecular weight of 100,000;

PVA represents polyvinyl alcohol (saponification degree: 95%) having a weight average molecular weight of 62,000;

PVME represents polyvinyl methyl ether having a weight average molecular weight of 10,000;

PEG represents polyethylene glycol having a weight average molecular weight of 26,000;

PEO represents polyethylene oxide having a weight average molecular weight of 200,000;

PPP represents polyoxyethylene polyoxypropyrene block copolymer having a weight average molecular weight of 9,000;

PEI represents polyethyleneimine having a weight average molecular weight of 10,000;

PAA represents polyacrylic acid having a weight average molecular weight of 25,000;

PAA-NH$_4$ represents ammonium ammonium polyacrylate having a weight average molecular weight of 20,000;

PAA-Na represents sodium polyacrylate having a weight average molecular weight of 20,000;

PAAM represents polyacrylamide having a weight average molecular weight of 1,000,000;

PSS-Na represents sodium polystyrene sulfonate having a weight average molecular weight of 100,000;

HEC represents hydroxyethyl cellulose having a weight average molecular weight of 1,000,000;

CMC-Na[*1] represents sodium carboxymethylcellulose having a weight average molecular weight of 10,000;

CMC-Na[*2] represents sodium carboxymethylcellulose having a weight average molecular weight of 330,000;

CMC-Na[*3] represents sodium carboxymethylcellulose having a weight average molecular weight of 90,000; and CMC-Na[*4] represents sodium carboxymethylcellulose having a weight average molecular weight of 20,000.

In the column entitled "alkali" of Tables 1 and 2:
TMAH represents tetramethylammonium hydroxide;
KOH represents potassium hydroxide;
NaOH represents sodium hydroxide;
NH$_3$ represents ammonia;
PIZ represents anhydrous piperazine; and
IMZ represents imidazole.

In the column entitled "abrasive grains" of Tables 1 and 2:
CS[*1] represents colloidal silica having an average primary particle diameter of 35 nm;
CS[*2] represents colloidal silica having an average primary particle diameter of 200 nm;
CS[*3] represents colloidal silica having an average primary particle diameter of 150 nm;
CS[*4] represents colloidal silica having an average primary particle diameter of 100 nm;
CS[*5] represents colloidal silica having an average primary particle diameter of 55 nm;
CS[*6] represents colloidal silica having an average primary particle diameter of 15 nm;
CS[*7] represents colloidal silica having an average primary particle diameter of 10 nm; and
CS[*8] represents colloidal silica having an average primary particle diameter of 5 nm.

In the column entitled "chelating agent" of Tables 1 and 2:
TTHA represents triethylenetetraaminehexaacetic acid;
DTPA represents diethylenetriaminepentaacetic acid; and
EDTPO represents ethylenediaminetetramethylphosphonic acid.

The polishing compositions of Examples 1 to 53 and Comparative Examples 1 to 26 were used in polishing of silicon wafers with a diameter of 200 mm and a thickness of 730 µm (p-type, crystal orientation <100>, and COP (crystal originated particle)-free). The polishing rates of the polishing compositions under the conditions of Table 3 were measured Results thereof are shown in the column entitled "polishing rate" of Tables 1 and 2. The polishing rate was obtained by dividing a thickness difference of each wafer between before and after polishing by a polishing period. To measure a wafer thickness, NANOMETRO 300TT, a flatness tester (manufactured by Kuroda Precision Industries, Ltd.) was used.

The polishing compositions of Example 1 to 53 and Comparative Examples 1 to 26 were used in polishing of silicon wafers, and the number of LPDs on the surface of each polished silicon wafer, attributable to the polishing process, was evaluated. Results thereof are shown in the column entitled "defects" of Tables 1 and 2. Specifically, silicon wafers with a diameter of 200 mm and a thickness of 730 µm (p-type, crystal orientation <100>, and COP-free) were subjected to preliminary polishing using the polishing compositions of Examples 1 to 53 and Comparative Examples 1 to 26 under the conditions shown in Table 3. Thereafter, GLANZOX-3900 manufactured by Fujimi Inc. was diluted in 20 times with pure water, and the obtained dilution was used in finish polishing under the condition shown in Table 4. Wafers obtained after finish polishing were subjected to SC-1 (Standard Clean 1) washing and IPA (isopropyl alcohol) steam drying. Then, a first measurement of LPDs of each wafer was performed using SURFSCAN SP1-TBI manufactured by KLA-Tencor Corporation. Thereafter, the same wafer was again subjected to SC-1 washing and IPA steam drying, and then a second measurement of LPDs was performed using SURFSCAN SP1-TBI. An LPD existing at the same location in the first and second measurements is defined as an LPD attributable to the polishing process, and the number of LPDs attributable to the polishing process per a wafer surface was measured. In the column entitled "defects", "E" (excellent)

indicates that the number of LPDs attributable to the polishing process per a wafer surface was less than 10; "G" (good) indicates that the number thereof was 10 or more to less than 20; "F" (fair) indicates that the number thereof was 20 or more to less than 30; and "P" (poor) indicates that the number thereof was 30 or more.

In order to evaluate the formation of hydrophilic films on wafer surfaces by the action of water soluble polymers, the polishing compositions of Examples 1 to 53 and Comparative Examples 1 to 26 were used in polishing of silicon wafers under the conditions of Table 3. After polishing, wetting of the surface of each silicon wafer was evaluated. Results thereof are shown in the column entitled "wetting" of Tables 1 and 2. Specifically, a wafer after polishing was slightly washed with water and wetting status of its surface was visually observed and evaluated. In the column entitled "wetting", numeral 0 indicates no wetting on a wafer surface; numeral 3 indicates that 30% of a wafer surface was wet; numeral 6 indicates that 60% of a wafer surface was wet; numeral 7 indicates that 70% of a wafer surface was wet; numeral 8 indicates that 80% of a wafer surface was wet; numeral 9 indicates that 90% of a wafer surface was wet; and numeral 10 indicates that 100% of a wafer surface was wet.

The polishing composition of Comparative Example 11 was excessively gelated, and thus it was impossible to use the composition for polishing a wafer.

TABLE 1

| | water soluble polymer | | alkali | | abrasive grains | | chelating agent | | polishing rate | | |
|---|---|---|---|---|---|---|---|---|---|---|---|
| | name | content [g/L] | name | content [g/L] | name | content [g/L] | name | content [g/L] | [µm/min.] | defects | wetting |
| Ex. 1 | PVP*$^1$ | 0.020 | TMAH | 2.0 | CS*$^1$ | 18.7 | TTHA | 0.30 | 0.260 | F | 10 |
| Ex. 2 | PVP*$^1$ | 0.015 | TMAH | 2.0 | CS*$^1$ | 18.7 | TTHA | 0.30 | 0.270 | G | 10 |
| Ex. 3 | PVP*$^1$ | 0.013 | TMAH | 2.0 | CS*$^1$ | 18.7 | TTHA | 0.30 | 0.268 | G | 10 |
| Ex. 4 | PVP*$^1$ | 0.010 | TMAH | 2.0 | CS*$^1$ | 18.7 | TTHA | 0.30 | 0.286 | E | 10 |
| Ex. 5 | PVP*$^1$ | 0.007 | TMAH | 2.0 | CS*$^1$ | 18.7 | TTHA | 0.30 | 0.300 | E | 10 |
| Ex. 6 | PVP*$^1$ | 0.005 | TMAH | 2.0 | CS*$^1$ | 18.7 | TTHA | 0.30 | 0.305 | E | 10 |
| Ex. 7 | PVP*$^1$ | 0.003 | TMAH | 2.0 | CS*$^1$ | 18.7 | TTHA | 0.30 | 0.302 | G | 10 |
| Ex. 8 | PVP*$^1$ | 0.002 | TMAH | 2.0 | CS*$^1$ | 18.7 | TTHA | 0.30 | 0.292 | F | 10 |
| Ex. 9 | PVP*$^1$ | 0.001 | TMAH | 2.0 | CS*$^1$ | 18.7 | TTHA | 0.30 | 0.290 | F | 10 |
| Ex. 10 | PVP*$^1$ | 0.010 | TMAH | 5.0 | CS*$^1$ | 18.7 | TTHA | 0.30 | 0.290 | E | 10 |
| Ex. 11 | PVP*$^1$ | 0.010 | TMAH | 4.0 | CS*$^1$ | 18.7 | TTHA | 0.30 | 0.295 | E | 10 |
| Ex. 12 | PVP*$^1$ | 0.010 | TMAH | 3.0 | CS*$^1$ | 18.7 | TTHA | 0.30 | 0.291 | E | 10 |
| Ex. 13 | PVP*$^1$ | 0.010 | TMAH | 0.5 | CS*$^1$ | 18.7 | TTHA | 0.30 | 0.263 | E | 10 |
| Ex. 14 | PVP*$^1$ | 0.010 | TMAH | 0.25 | CS*$^1$ | 18.7 | TTHA | 0.30 | 0.248 | E | 10 |
| Ex. 15 | PVP*$^1$ | 0.010 | TMAH | 0.10 | CS*$^1$ | 18.7 | TTHA | 0.30 | 0.220 | E | 10 |
| Ex. 16 | PVP*$^1$ | 0.010 | KOH | 1.5 | CS*$^1$ | 18.7 | TTHA | 0.30 | 0.240 | E | 10 |
| Ex. 17 | PVP*$^1$ | 0.005 | KOH | 1.5 | CS*$^1$ | 18.7 | TTHA | 0.30 | 0.262 | E | 10 |
| Ex. 18 | PVP*$^1$ | 0.010 | NaOH | 1.0 | CS*$^1$ | 18.7 | TTHA | 0.30 | 0.238 | E | 10 |
| Ex. 19 | PVP*$^1$ | 0.010 | NH$_3$ | 0.87 | CS*$^1$ | 18.7 | TTHA | 0.30 | 0.222 | E | 10 |
| Ex. 20 | PVP*$^1$ | 0.010 | PIZ | 3.0 | CS*$^1$ | 18.7 | TTHA | 0.30 | 0.428 | E | 10 |
| Ex. 21 | PVP*$^1$ | 0.010 | IMZ KOH | 3.0 1.5 | CS*$^1$ | 18.7 | TTHA | 0.30 | 0.410 | E | 10 |
| Ex. 22 | PVP*$^1$ | 0.010 | TMAH | 2.0 | CS*$^1$ | 45.0 | TTHA | 0.30 | 0.325 | E | 10 |
| Ex. 23 | PVP*$^1$ | 0.010 | TMAH | 2.0 | CS*$^1$ | 35.0 | TTHA | 0.30 | 0.316 | E | 10 |
| Ex. 24 | PVP*$^1$ | 0.010 | TMAH | 2.0 | CS*$^1$ | 25.0 | TTHA | 0.30 | 0.302 | E | 10 |
| Ex. 25 | PVP*$^1$ | 0.010 | TMAH | 2.0 | CS*$^1$ | 5.0 | TTHA | 0.30 | 0.268 | E | 10 |
| Ex. 26 | PVP*$^1$ | 0.010 | TMAH | 2.0 | CS*$^1$ | 3.0 | TTHA | 0.30 | 0.259 | E | 10 |
| Ex. 27 | PVP*$^1$ | 0.010 | TMAH | 2.0 | CS*$^1$ | 1.0 | TTHA | 0.30 | 0.231 | E | 10 |
| Ex. 28 | PVP*$^1$ | 0.010 | TMAH | 2.0 | CS*$^2$ | 18.7 | TTHA | 0.30 | 0.306 | E | 10 |
| Ex. 29 | PVP*$^1$ | 0.010 | TMAH | 2.0 | CS*$^3$ | 18.7 | TTHA | 0.30 | 0.299 | E | 10 |
| Ex. 30 | PVP*$^1$ | 0.010 | TMAH | 2.0 | CS*$^4$ | 18.7 | TTHA | 0.30 | 0.292 | E | 10 |
| Ex. 31 | PVP*$^1$ | 0.010 | TMAH | 2.0 | CS*$^5$ | 18.7 | TTHA | 0.30 | 0.290 | E | 10 |
| Ex. 32 | PVP*$^1$ | 0.010 | TMAH | 2.0 | CS*$^6$ | 18.7 | TTHA | 0.30 | 0.284 | E | 10 |
| Ex. 33 | PVP*$^1$ | 0.010 | TMAH | 2.0 | CS*$^7$ | 18.7 | TTHA | 0.30 | 0.276 | E | 10 |
| Ex. 34 | PVP*$^1$ | 0.010 | TMAH | 2.0 | CS*$^8$ | 18.7 | TTHA | 0.30 | 0.249 | E | 10 |
| Ex. 35 | PVP*$^1$ | 0.010 | KOH | 3.0 | CS*$^5$ | 18.7 | TTHA | 0.30 | 0.258 | E | 10 |
| Ex. 36 | PVP*$^1$ | 0.010 | KOH | 1.5 | CS*$^5$ | 18.7 | TTHA | 0.30 | 0.243 | E | 10 |
| Ex. 37 | PVP*$^1$ | 0.010 | KOH | 0.5 | CS*$^5$ | 18.7 | TTHA | 0.30 | 0.210 | E | 10 |
| Ex. 38 | PVP*$^1$ | 0.010 | PIZ | 3.0 | CS*$^5$ | 18.7 | TTHA | 0.30 | 0.434 | E | 10 |
| Ex. 39 | PVP*$^1$ | 0.010 | KOH | 4.5 | FS | 18.7 | TTHA | 0.30 | 0.254 | E | 10 |
| Ex. 40 | PVP*$^1$ | 0.010 | TMAH | 2.0 | CS*$^1$ | 18.7 | — | — | 0.289 | E | 10 |
| Ex. 41 | PVP*$^1$ | 0.010 | TMAH | 2.0 | CS*$^1$ | 18.7 | DTPA | 0.30 | 0.283 | E | 10 |
| Ex. 42 | PVP*$^1$ | 0.010 | TMAH | 2.0 | CS*$^1$ | 18.7 | EDTPO | 0.30 | 0.285 | E | 10 |
| Ex. 43 | PVP*$^2$ | 0.010 | TMAH | 2.0 | CS*$^1$ | 18.7 | TTHA | 0.30 | 0.290 | E | 10 |
| Ex. 44 | PVP*$^3$ | 0.010 | TMAH | 2.0 | CS*$^1$ | 18.7 | TTHA | 0.30 | 0.290 | E | 10 |
| Ex. 45 | PVP*$^4$ | 0.010 | TMAH | 2.0 | CS*$^1$ | 18.7 | TTHA | 0.30 | 0.280 | E | 10 |
| Ex. 46 | PVP*$^3$ | 0.015 | KOH | 1.5 | CS*$^5$ | 18.7 | TTHA | 0.30 | 0.239 | G | 10 |
| Ex. 47 | PVP*$^3$ | 0.005 | KOH | 1.5 | CS*$^5$ | 18.7 | TTHA | 0.30 | 0.252 | E | 10 |
| Ex. 48 | PNVF | 0.010 | TMAH | 2.0 | CS*$^1$ | 18.7 | TTHA | 0.30 | 0.290 | E | 10 |
| Ex. 49 | PNVF | 0.010 | TMAH | 2.0 | CS*$^5$ | 18.7 | TTHA | 0.30 | 0.293 | E | 10 |
| Ex. 50 | PNVF | 0.003 | TMAH | 2.0 | CS*$^1$ | 18.7 | TTHA | 0.30 | 0.294 | G | 10 |
| Ex. 51 | PNVF | 0.005 | TMAH | 2.0 | CS*$^1$ | 18.7 | TTHA | 0.30 | 0.290 | E | 10 |
| Ex. 52 | PNVF | 0.007 | TMAH | 2.0 | CS*$^1$ | 18.7 | TTHA | 0.30 | 0.304 | E | 10 |
| Ex. 53 | PNVF | 0.013 | TMAH | 2.0 | CS*$^1$ | 18.7 | TTHA | 0.30 | 0.252 | G | 10 |

TABLE 2

| | water soluble polymer | | alkali | | abrasive grains | | chelating agent | | polishing rate [μm/min.] | defects | wetting |
|---|---|---|---|---|---|---|---|---|---|---|---|
| | name | content [g/L] | name | content [g/L] | name | content [g/L] | name | content [g/L] | | | |
| C. Ex. 1  | —        | —     | TMAH | 2.0 | CS*1 | 18.7 | TTHA | 0.30 | 0.285 | P | 0  |
| C. Ex. 2  | —        | —     | KOH  | 1.5 | CS*1 | 18.7 | TTHA | 0.30 | 0.237 | P | 0  |
| C. Ex. 3  | —        | —     | KOH  | 1.5 | CS*1 | 18.7 | TTHA | 0.30 | 0.243 | P | 0  |
| C. Ex. 4  | PVA      | 0.010 | TMAH | 2.0 | CS*1 | 18.7 | TTHA | 0.30 | 0.273 | P | 10 |
| C. Ex. 5  | PVA      | 0.010 | TMAH | 2.0 | CS*5 | 18.7 | TTHA | 0.30 | 0.277 | P | 10 |
| C. Ex. 6  | PVME     | 0.10  | TMAH | 2.0 | CS*1 | 18.7 | TTHA | 0.30 | 0.000 | P | 0  |
| C. Ex. 7  | PEG      | 0.10  | TMAH | 2.0 | CS*1 | 18.7 | TTHA | 0.30 | 0.130 | P | 3  |
| C. Ex. 8  | PEG      | 0.10  | KOH  | 1.5 | CS*1 | 18.7 | TTHA | 0.30 | 0.290 | P | 0  |
| C. Ex. 9  | PEO      | 0.10  | TMAH | 2.0 | CS*1 | 18.7 | TTHA | 0.30 | 0.090 | P | 0  |
| C. Ex. 10 | PPP      | 0.050 | TMAH | 2.0 | CS*1 | 18.7 | TTHA | 0.30 | 0.128 | P | 0  |
| C. Ex. 11 | PEI      | 0.10  | TMAH | 2.0 | CS*1 | 18.7 | TTHA | 0.30 | —     | — | —  |
| C. Ex. 12 | PAA      | 0.10  | TMAH | 2.0 | CS*1 | 18.7 | TTHA | 0.30 | 0.400 | P | 8  |
| C. Ex. 13 | PAA-NH4  | 0.10  | TMAH | 2.0 | CS*1 | 18.7 | TTHA | 0.30 | 0.470 | P | 8  |
| C. Ex. 14 | PAA-Na   | 0.10  | TMAH | 2.0 | CS*1 | 18.7 | TTHA | 0.30 | 0.530 | P | 6  |
| C. Ex. 15 | PAAM     | 0.050 | TMAH | 2.0 | CS*1 | 18.7 | TTHA | 0.30 | 0.155 | P | 0  |
| C. Ex. 16 | PSS-Na   | 0.50  | TMAH | 2.0 | CS*1 | 18.7 | TTHA | 0.30 | 0.490 | P | 8  |
| C. Ex. 17 | PSS-Na   | 0.10  | TMAH | 2.0 | CS*1 | 18.7 | TTHA | 0.30 | 0.420 | P | 8  |
| C. Ex. 18 | HEC      | 0.010 | TMAH | 2.0 | CS*1 | 18.7 | TTHA | 0.30 | 0.281 | P | 10 |
| C. Ex. 19 | CMC-Na*1 | 0.010 | TMAH | 2.0 | CS*1 | 18.7 | TTHA | 0.30 | 0.285 | P | 10 |
| C. Ex. 20 | CMC-Na*2 | 0.10  | KOH  | 1.5 | CS*1 | 18.7 | TTHA | 0.30 | 0.330 | P | 0  |
| C. Ex. 21 | CMC-Na*3 | 0.50  | KOH  | 1.5 | CS*1 | 18.7 | TTHA | 0.30 | 0.290 | P | 0  |
| C. Ex. 22 | CMC-Na*3 | 0.10  | KOH  | 1.5 | CS*1 | 18.7 | TTHA | 0.30 | 0.420 | P | 0  |
| C. Ex. 23 | CMC-Na*4 | 0.50  | KOH  | 1.5 | CS*1 | 18.7 | TTHA | 0.30 | 0.200 | P | 9  |
| C. Ex. 24 | CMC-Na*4 | 0.10  | KOH  | 1.5 | CS*1 | 18.7 | TTHA | 0.30 | 0.420 | P | 7  |
| C. Ex. 25 | CMC-Na*1 | 0.50  | KOH  | 1.5 | CS*1 | 18.7 | TTHA | 0.30 | 0.330 | P | 10 |
| C. Ex. 26 | CMC-Na*1 | 0.10  | KOH  | 1.5 | CS*1 | 18.7 | TTHA | 0.30 | 0.400 | P | 7  |

TABLE 3 conditions for preliminary polishing conditions

Polishing Machine: PNX-322 manufactured by Okamoto Machine Tool Works, Ltd.
Polishing pad: SUBA 400 manufactured by Nitta Haas Inc.
Wafer polishing pressure: 15 kPa
Rotation speed of surface plate: 50 rpm
Polishing period: 4 min.
Supply rate of polishing composition: 1 L/min.
Temperature of polishing composition: 20° C.
Temperature of cooling water for surface plate: 20° C.
Rotation speed of carrier: 50 rpm

TABLE 4 conditions for finishing polishing polishing machine: PNX-322 manufactured by Okamoto Machine Tool Works, Ltd.
polishing pad: Surfin 000FM manufactured by Fujimi Inc
wafer polishing pressure: 15 kPa
rotational speed of platen: 30 rpm
polishing period: 4 min.
feed rate of polishing composition: 0.5 L/min.
temperature of polishing composition: 20° C.
temperature of cooling water for platen: 20° C.
rotation speed of carrier: 30 rpm As shown in Tables 1 and 2, the polishing compositions of Examples 1 to 53 were evaluated regarding defects as fair or better, and obtained practically satisfactory polishing rates. In contrast, the polishing compositions of Comparative Examples 1 to 26 were evaluated regarding detects as poor except Comparative Example 11, whereby polishing could not be performed.

The invention claimed is:

1. A polishing composition consisting essentially of comprising:
   poly(N-vinylformamide);
   abrasive grains of colloidal silica or fumed silica;
   an alkali; and
   water.

2. The polishing composition according to claim 1, wherein the poly(N-vinylformamide) has a weight average molecular weight of 6,000 to 4,000,000.

3. A polishing composition consisting essentially of:
   poly(N-vinylformamide);
   abrasive grains of colloidal silica or fumed silica;
   an alkali;
   a chelating agent; and
   water.

4. The polishing composition according to claim 3, wherein the chelating agent is an aminocarboxylic acid-based chelating agent.

5. The polishing composition according to claim 3, wherein the chelating agent is a phosphonic acid-based chelating agent.

6. The polishing composition according to claim 3, wherein the chelating agent is ethylenediaminetetraacetic acid, diethylenetriaminepentaacetic acid, triethylenetetraaminehexaacetic acid, ethylenediaminetetramethylphosphonic acid, or diethylenetriaminepentamethylphosphonic acid.

7. The polishing composition according to claim 3, wherein the chelating agent is ethylenediaminetetraacetic acid.

8. The polishing composition according to claim 3, wherein the chelating agent is diethylenetriaminepentaacetic acid.

9. The polishing composition according to claim 3, wherein the chelating agent is triethylenetetraaminehexaacetic acid.

10. The polishing composition according to claim 3, wherein the chelating agent is ethylenediaminetetramethylphosphonic acid.

11. The polishing composition according to claim 3, wherein the chelating agent is diethylenetriaminepentamethylphosphonic acid.

12. A method of polishing, comprising polishing a surface of a semiconductor wafer using a polishing composition consisting essentially of poly(N-vinylformamide), abrasive grains of colloidal silica or fumed silica, an alkali, and water.

13. The method according to claim 12, wherein said polishing includes preliminary polishing a surface of a semiconductor wafer using said polishing composition and finish polishing a preliminary polished surface of the semiconductor using a polishing composition different from said polishing composition.

* * * * *